(12) United States Patent
Griggs

(10) Patent No.: US 8,847,687 B2
(45) Date of Patent: Sep. 30, 2014

(54) MULTI-PATH BROADBAND AMPLIFIER

(75) Inventor: Keith C. Griggs, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 50 days.

(21) Appl. No.: 13/429,626

(22) Filed: Mar. 26, 2012

(65) Prior Publication Data

US 2013/0249637 A1    Sep. 26, 2013

(51) Int. Cl.
*H03F 3/68* (2006.01)
(52) U.S. Cl.
USPC ..................................... 330/295; 330/124 R
(58) Field of Classification Search
CPC .......................................... H03F 3/68
USPC ................. 330/295, 124 R, 84, 126
See application file for complete search history.

(56) References Cited

U.S. PATENT DOCUMENTS

| | | | |
|---|---|---|---|
| 6,803,825 B2 | 10/2004 | Chiou et al. | |
| 7,589,589 B2 * | 9/2009 | Kusunoki | 330/51 |
| 7,800,448 B2 * | 9/2010 | Blednov | 330/295 |
| 8,482,353 B2 * | 7/2013 | Blednov | 330/295 |
| 2010/0277215 A1 | 11/2010 | Tam et al. | |

OTHER PUBLICATIONS

E. Janata, "Instrumentation of Kinetic Spectroscopy-18: A wideband dc-coupled amplifier", Radiation Physics and Chemistry 66 (2003), pp. 215-218.

* cited by examiner

*Primary Examiner* — Henry Choe

(57) ABSTRACT

An amplifier device having an extended bandwidth includes a DC coupled amplifier and multiple low noise amplifiers connected in series with one another and connected in parallel with at least a portion of the DC coupled amplifier. The DC coupled amplifier has a broad bandwidth, and each of the low noise amplifiers has a narrow bandwidth and a center frequency higher than a high end frequency of the broad bandwidth of the DC coupled amplifier. The extended bandwidth of the amplifier device is a combination of the broad bandwidth and the first narrow bandwidth.

17 Claims, 6 Drawing Sheets

MULTI-PATH BROADBAND AMPLIFIER

BACKGROUND

Conventional high bandwidth or broadband amplifiers include single path and multi-path designs. Generally, the multi-path designs are dual path architectures. A dual path amplifier is typically designed to split frequency response into two bands via a low bandwidth path and a high bandwidth path. The low bandwidth path covers from DC up to a crossover frequency (fco) and the high bandwidth (or broadband) path covers from the crossover frequency fco to the maximum bandwidth of the amplifier. The low bandwidth path typically provides less than about one percent of the total bandwidth of the dual-path receiver. Amplifiers employing this technique may be sufficient in some cases, but they do not achieve as high of frequency band edges as narrowband amplifiers used in wireless communications applications, known as a low noise amplifier (LNA).

Also, a drawback of conventional single path DC coupled amplifiers is that they require several support circuits to work properly, including circuits for gain adjustment, thermal compensation, level translation, and cascading of stages, for example. These support circuits, along with biasing circuits, slow down the DC coupled amplifiers. In comparison, support circuits are either not needed or simplified in LNAs.

SUMMARY

In a representative embodiment, an amplifier device having an extended bandwidth includes a DC coupled amplifier having a broad bandwidth and multiple first low noise amplifiers connected in series with one another and connected in parallel with at least a portion of the DC coupled amplifier. The first low noise amplifiers have a first narrow bandwidth and a center frequency higher than a high end frequency of the broad bandwidth. The extended bandwidth of the amplifier device includes a combination of the broad bandwidth and the first narrow bandwidth.

In another representative embodiment, an amplifier device includes first and second paths, and a summing node. The first path includes a DC coupled amplifier, the first path having a first path delay. The second path is connected in parallel with the first path and includes an AC coupling capacitor connected in series with at least one high frequency amplifier, the second path having a second delay that is substantially the same as the first delay. The summing node is configured to combine a first signal output by the first path and a second signal output by the second path to provide an output signal of the amplifier device. A total bandwidth of the amplifier device includes a combination of a broad bandwidth of the DC coupled amplifier and a narrow bandwidth of the at least one low noise amplifier. The at least one high frequency amplifier has a center frequency higher than a high end frequency of the broad bandwidth of the DC coupled amplifier.

In yet another representative embodiment, an amplifier device having an extended bandwidth includes first and second paths. The first path includes a DC coupled amplifier having a broad bandwidth, an output of the DC coupled amplifier being connected to a summing node. The second path includes an AC coupling capacitor, connected to a high frequency pick-off node of the DC coupled amplifier, and at least one first low noise amplifier connected between the coupling capacitor and the summing node, the at least one first low noise amplifier having a first narrow bandwidth and a center frequency higher than a high end frequency of the broad bandwidth of the DC coupled amplifier. The extended bandwidth of the amplifier device at the summing node includes a combination of the broad bandwidth and the first narrow bandwidth.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

A multi-path broadband amplifier, according to various embodiments, extends the bandwidth of a DC coupled amplifier to upper frequency bands near that of a high frequency, narrowband amplifier, such as a low noise amplifier (LNA). Generally, the multi-path broadband amplifier is effectively divided into two distinct types of amplifiers for providing a combined extended bandwidth. For example, in an embodiment, the multi-path broadband amplifier is a dual path amplifier that includes a moderate broadband DC coupled amplifier in a first path and one or more AC coupled LNAs, or other high frequency, narrow bandwidth amplifiers, connected in series in a second path, which may be connected in parallel with the first path. Throughout this description, a narrow bandwidth amplifier may refer to a typical LNA (or other narrowband amplifier), or to an LNA modified to have an extended bandwidth, as would be apparent to one skilled in the art. In any case, the narrow bandwidth amplifier has a bandwidth narrower than the broadband DC coupled amplifier, mentioned above. Other embodiments include multi-path broadband amplifiers with more than two paths, where each of the additional paths are connected substantially in parallel with at least the LNAs of the second path, and likewise includes one or more AC coupled LNAs connected in series.

Generally, the greater the number of parallel paths, the higher the upper frequency band output by the broadband amplifier. Also, gain and delay of each path is based, in part, on the number of LNAs connected in series. That is, the greater the number of LNAs in any one path, the higher the gain and the greater the delay of the signal output by that path. As mentioned above, as compared to DC coupled amplifiers, support circuits are either not needed or simplified in LNAs. Therefore, LNAs are inherently faster than DC coupled amplifiers because they are unencumbered with the extensive support circuits.

Figure 1A:
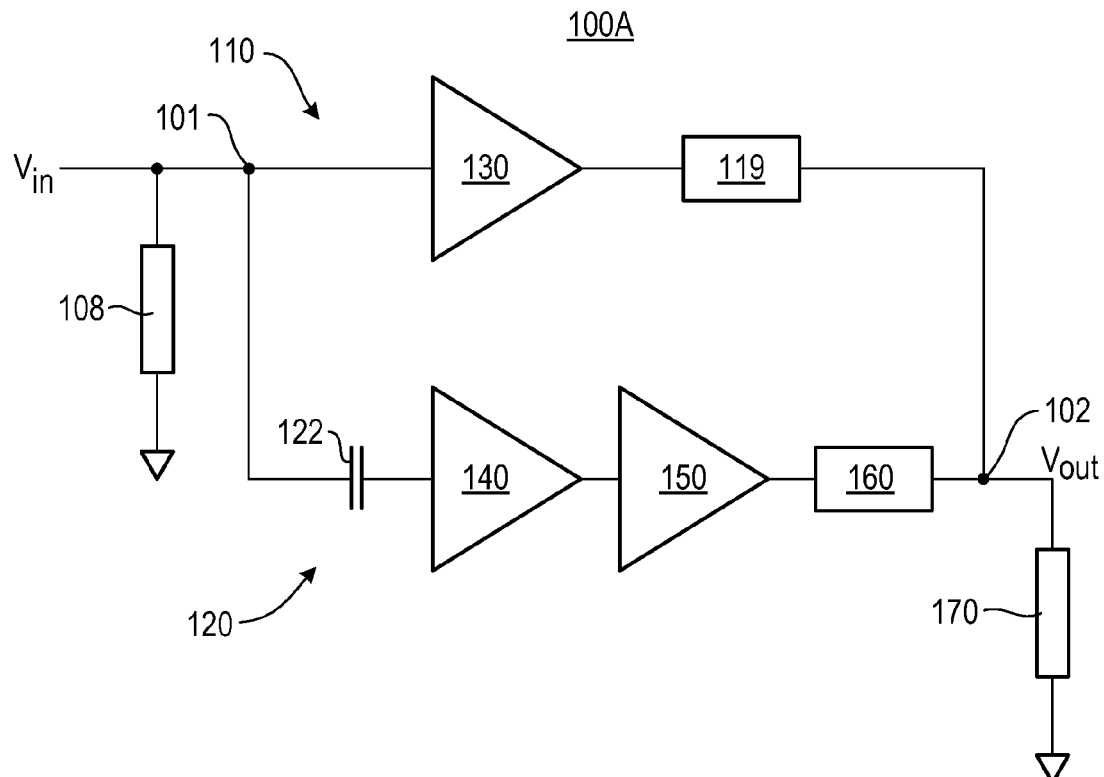
FIGS. 1A and 1B are simplified block diagrams illustrating multi-path broadband amplifiers, according to representative embodiments.
Figure 1B:
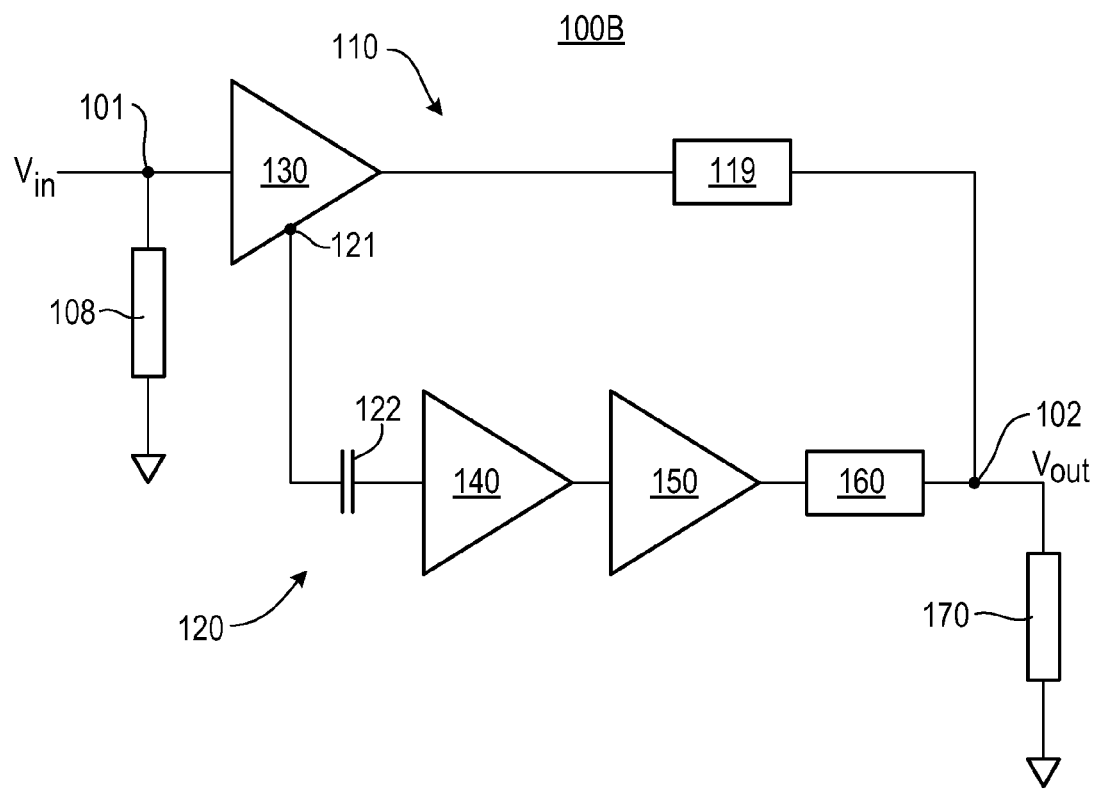

FIGS. 1A and 1B are simplified block diagrams illustrating multi-path broadband amplifiers, according to representative embodiments. Generally, FIG. 1A depicts an embodiment in which a second path, including one or more LNAs, is connected in parallel with an entire first path, including a DC coupled amplifier. FIG. 1B depicts an embodiment in which the second path, including one or more LNAs, is connected in parallel with a portion of the first path, where the second path originates at a high frequency "pick-off" of the DC coupled amplifier in the first path, as described in detail below. In the various embodiments, the first path is a low frequency path and the second path is a high frequency path, relative to one another.

Referring to FIG. 1A, multi-path broadband amplifier 100A is a dual path amplifier, and includes first path 110 and second path 120 connected in parallel with the first path 110. That is, the first and second paths 110 and 120 each originate at input node 101 and terminate at summing node 102, so that the second path 120 is in parallel with the entire first path 110. The input node 101 is connected to ground via resistor 108, which may be a 50 ohm resistor, for example.

The first path 110 includes representative DC coupled amplifier 130 and resistor 119, which may be a 50 ohm resistor, for example. The DC coupled amplifier 130 may be a differential amplifier or a single ended amplifier, and an input of the DC coupled amplifier 130 is connected to the input node 101 to receive input voltage signal Vin. The DC coupled amplifier 130 is a broad bandwidth amplifier for outputting a broadband signal, and may have an output frequency range from zero (DC) to an upper end of about 30 GHz to about 50 GHz, for example. Of course, the first path 110 may include a DC coupled amplifier having various frequency ranges, and/or may include another type of broad bandwidth amplifier, without departing from the scope of the present teachings.

The second path 120 of the multi-path broadband amplifier 100A includes AC coupling capacitor 122 and representative LNAs 140 and 150, connected in series (cascaded). The second path 120 may further include an LNA output stage 160 connected in series to the LNA 150, discussed further below. In the depicted configuration, the AC coupling capacitor 122 is connected to the input node 101, and an input of the LNA 140 is connected to the AC coupling capacitor 122 to receive the input voltage signal Vin. Each of the LNAs 140 and 150 is a high frequency, narrow bandwidth amplifier for outputting a narrow bandwidth signal. For example, each of the LNAs 140 and 150 has an output center frequency higher than the high end frequency of the bandwidth of the DC coupled amplifier 130, e.g., in a range of about 30 GHz to about 100 GHz, and a narrow bandwidth of about 4 GHz to about 40 GHz. Of course, the second path 120 may include LNAs having different center frequencies and bandwidths, and/or may include another type of high frequency narrow bandwidth amplifier, without departing from the scope of the present teachings.

Two representative LNAs (LNAs 140 and 150) are shown in FIG. 1A for purposes of discussion. It is understood, however, that the second path 120 may alternatively include any number of one or more LNAs connected in series, to provide unique benefits for any particular situation or to meet application specific design requirements of various implementations, as would be apparent to one skilled in the art.

Notably, continuity of both amplitude and phase of signals provided by the first and second paths 110 and 120, respectively, is to be maintained throughout the operating bandwidth of the multi-path broadband amplifier 100A. Generally, the greater the number of LNAs connected in series, the higher the gain (affecting amplitude or magnitude) and the longer the delay (affecting phase) of the second path 120. Therefore, the number of LNAs in the second path 120 may be determined to provide a collective second gain and second delay that match or are substantially the same as a first gain and a first delay of the first path 110. In addition, component values of the LNAs, such as inductor and capacitor values and/or transistor sizes, may be varied, e.g., up to about 10 to 20 percent, in order to further affect gain without adding or removing LNAs. Likewise, a delay element, such as a transmission line, may be included in the DC coupled amplifier 130 in order to affect delay of the first path 110.

The first path 110 and the second path 120 terminate at the summing node 102, where a first amplified signal from the first path 110 and a second amplified signal from the second path 120 are combined as output signal Vout. The output signal Vout is applied to representative load 170, indicated by a 50 ohm resistor, for example. The total bandwidth of the multi-path broadband amplifier 100A is therefore the combination of the broad bandwidth of the DC coupled amplifier 130 and the narrow bandwidth of the LNAs 140 and 150. An overall magnitude response of the combined output signal of the multi-path broadband amplifier 100A is substantially flat, and an overall phase response of the combined output signal of the multi-path broadband amplifier 100A is linear or transitions smoothly.

Accordingly, the narrow bandwidth of the LNAs 140 and 150 effectively extends the broad bandwidth of the DC coupled amplifier 130. Because the DC coupled amplifier 130 is broad bandwidth amplifier, it provides the most significant portion of the total (extended) bandwidth, while the LNAs 140 and 150 marginally increase the bandwidth of the DC coupled amplifier 130 at the high end frequencies by the amount of the corresponding narrow bandwidth. In various embodiments, the DC coupled amplifier 130 may provide 50 percent or more of the total bandwidth of the multi-path broadband amplifier 100A. For example, the DC coupled amplifier 130 may provide a 50 GHz bandwidth from DC to about 50 GHz, and the LNAs 140 and 150 may provide a 20 GHz bandwidth centered at a center frequency of about 60 GHz. In this case the multi-path broadband amplifier 100A has a total bandwidth from DC to about 70 GHz, of which the DC coupled amplifier 130 provides 71 percent of the total bandwidth. Notably, the LNAs 140 and 150 work particularly well over fairly narrow frequency ranges (narrow bandwidths) due to their resonant high Q nature. Referring to FIG. 1B, multi-path broadband amplifier 100B is a dual path amplifier, and includes first path 110 and second path 120 connected in parallel with a portion of the first path 110. That is, the first path 110 originates at the input node 101 and terminates at the summing node 102, and the second path 120 originates at a high frequency pick-off node 121 of DC coupled amplifier 130 in the first path 110, as discussed below, and terminates at the summing node 102. The input node 101 is connected to ground via resistor 108, which may be a 50 ohm resistor, for example.

More particularly, the first path 110 includes the DC coupled amplifier 130 and the resistor 119. The second path 120 includes the AC coupling capacitor 122 and representative LNAs 140 and 150, connected in series (cascaded). The second path 120 may further include an LNA output stage 160 connected in series to the LNA 150. As discussed above, although two representative LNAs are shown in FIG. 1B, for purposes of discussion, it is understood that the second path 120 may include one or more LNAs connected in series, without departing from the scope of the present teachings.

In the depicted configuration, the LNA 140 receives high frequency input voltage signal Vin output from the high frequency pick-off node 121 of the DC coupled amplifier 130. Accordingly, the AC coupling capacitor 122 and the LNAs 140 and 150 are connected in parallel with a portion of the DC coupled amplifier 130 (following the high frequency pick-off node 121) and the resistor 119. Using the high frequency pick-off node 121 from the DC coupled amplifier 130 avoids having multiple pick-offs for the same input voltage signal Vin, e.g., at the input node 101, thus reducing load on the input node 101. The high frequency pick-off node 121 may be located after just one transistor of the DC coupled amplifier 130, for example, so that the signal received by the AC coupling capacitor 122 is essentially the same bandwidth as the original input voltage signal Vin. An example of the circuitry of the DC coupled amplifier 130 and the high frequency pick-off node 121 is discussed below with reference to FIGS. 4A and 4B.

The first path 110 and the second path 120 terminate at summing node 102, where a first amplified signal from the first path 110 and a second amplified signal from the second path are combined as combined output signal Vout. The output signal Vout may be applied to the representative load 170. The total bandwidth of the multi-path broadband amplifier 100B is therefore the combination of the broad bandwidth of the DC coupled amplifier 130 and the narrow bandwidth of the LNAs 140 and 150, as discussed above. Also, as stated above with regard to the multi-path broadband amplifier 100A, an overall magnitude response of the combined output signal of the multi-path broadband amplifier 100B is substantially flat, and an overall phase response of the combined output signal of the multi-path broadband amplifier 100B is linear or transitions smoothly.

Figure 2:
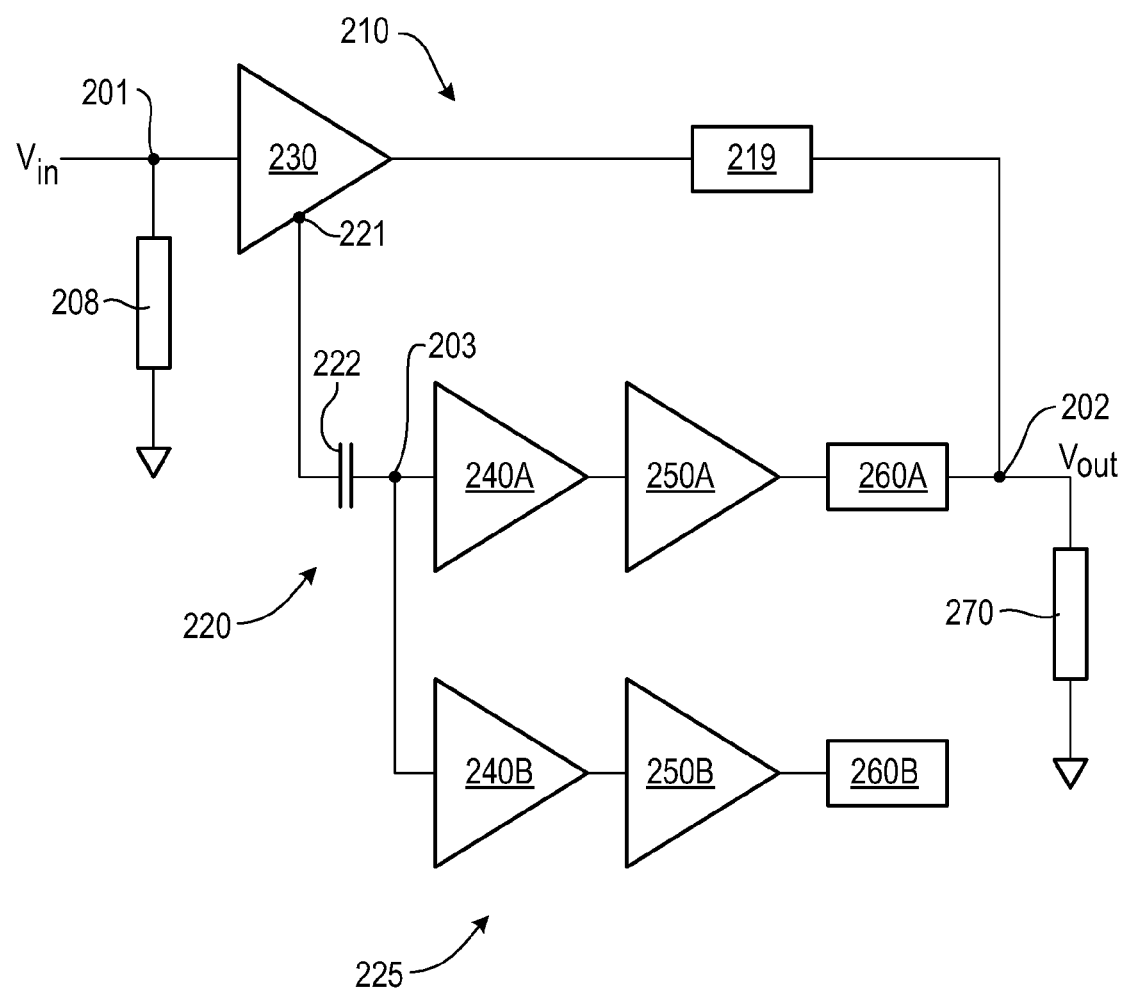
FIG. 2 is a simplified block diagram illustrating a multi-path broadband amplifier, according to a representative embodiment.

FIG. 2 is a simplified block diagram illustrating a multi-path broadband amplifier, according to a representative embodiment.

Referring to FIG. 2, multi-path broadband amplifier 200 includes first path 210, second path 220 connected in parallel with a portion of the first path 210, and third path 225 connected in parallel with a portion of the second path 220. That is, the first path 210 originates at input node 201, the second path 220 originates at a high frequency pick-off node 221 of DC coupled amplifier 230 in the first path 210, and the third path 225 originates at coupling node 203 in the second path 220. Each of the first path 210, the second path 220 and the third path 225 and terminates at summing node 202, where a first amplified signal from the first path 210, a second amplified signal from the second path 220 and a third amplified signal from the third path 225 are combined as output signal Vout.

The first path 210 includes representative DC coupled amplifier 230 and resistor 219. The DC coupled amplifier 230 may be a differential amplifier or a single ended amplifier, and an input of the DC coupled amplifier 230 is connected to the input node 201 to receive input voltage signal Vin. The input node 201 is connected to ground via resistor 208, which also may be a 50 ohm resistor, for example. The DC coupled amplifier 230 is a broad bandwidth amplifier, and may have an output frequency range from zero (DC) to an upper end of about 30 GHz to about 50 GHz, for example. Of course, the first path 210 may include a DC coupled amplifier having various frequency ranges, and/or may include another type of broad bandwidth amplifier, without departing from the scope of the present teachings.

The second path 220 of the multi-path broadband amplifier 200 includes AC coupling capacitor 222 and representative LNAs 240A and 250A connected in series. The second path 220 may further include an LNA output stage 260A connected in series to the LNA 250A. In the depicted configuration, the AC coupling capacitor 222 is connected to the high frequency pick-off node 221 of the DC coupled amplifier 230, and an input of the LNA 240A is connected to the AC coupling capacitor 222 via the coupling node 203 to receive the (slightly reduced bandwidth) input voltage signal Vin.

The third path 225 of the multi-path broadband amplifier 200 includes representative LNAs 240B and 250B, connected in series. The third path 225 may further include an LNA output stage 260B connected in series to the LNA 250B. In the depicted configuration, an input of the LNA 240B is connected to the AC coupling capacitor 222 via the coupling node 203 to receive the (slightly reduced bandwidth) input voltage signal Vin. Thus, the cascaded LNA 240B, LNA 250B and LNA output stage 260B of the third path 225 are connected in parallel with the cascaded LNA 240A, LNA 250A and LNA output stage 260A of the second path 220.

Each of the LNAs 240A and 250A in the second path 220 and the LNAs 240B and 250B in the third path 225 is a high frequency, narrow bandwidth amplifier. For example, each of the LNAs 240A, 250A and 240B, 250B has an output center frequency higher than the high end frequency of the bandwidth of the DC coupled amplifier 230, e.g., in a range of about 30 GHz to about 100 GHz, and a bandwidth in a range of about 4 GHz to about 40 GHz. Of course, the second path 220 and/or the third path 225 may include LNAs having different center frequencies and bandwidths, and/or may include another type of high frequency narrow bandwidth amplifier, without departing from the scope of the present teachings.

Two representative LNAs 240A, 250A and 240B, 250B are shown in FIG. 2 for purposes of discussion. It is understood, however, that each of the second path 220 and the third path 225 may alternatively include one LNA or more than two LNAs connected in series, to provide unique benefits for any particular situation or to meet application specific design requirements of various implementations, as would be apparent to one skilled in the art. Generally, the greater the number of LNAs connected in series, the higher the gain and the longer the delay (phase) of the corresponding second path 220 or third path 225. The gain and delay of each of the second path 220 and the third path 225 must be substantially the same as the gain and delay of the first path 210. Therefore, the number of LNAs in the second path 220 may be selected to provide a collective second gain and second delay that are substantially the same as a first gain and a first delay of the first path 210, and the number of LNAs in the third path 225 may be selected to provide a collective third gain and third delay that are substantially the same as the first gain and the first delay of the first path 210.

Moreover, two representative high frequency paths, the second path 220 and the third path 225, are shown in FIG. 2 for purposes of discussion. It is understood, however, that the multi-path broadband amplifier 200 may alternatively include more than two high frequency paths with corresponding LNAs connected in parallel to provide unique benefits for any particular situation or to meet application specific design requirements of various implementations, as would be apparent to one skilled in the art. As mentioned above, the greater the number of high frequency paths, the higher the upper frequency band output by the multi-path broadband amplifier 200. For example, each additional high frequency path connected in parallel may provide an additional 10 GHz to the upper band of the multi-path broadband amplifier 200.

The first path 210, the second path 220 and the third path 225 each terminate at the summing node 202, where a first amplified signal from the first path 210, a second amplified signal from the second path 220 and a third amplified signal from the third path 225 are combined as output signal Vout. The output signal Vout is applied to representative load 270, indicated by a 50 ohm resistor, for example. The total bandwidth of the multi-path broadband amplifier 200 is therefore the combination of the broad bandwidth of the DC coupled amplifier 230 and the narrow bandwidths of the LNAs 240A and 250A in the second path 220 and the LNAs 240B and 250B in the third path 225.

Notably, although depicted FIG. 2 depicts the second path 220 originating at the high frequency pick-off node 221 for purposes of illustration, it is understood that in alternative embodiments, the second path 220 may originate at the same input node (e.g., input node 201) as the first path 210, similar to the multi-path broadband amplifier 100A discussed above with reference to FIG. 1A. In this alternative configuration, the third path 225 (and any additional high frequency paths) would still originate after the AC coupling capacitor 222 (e.g., at the coupling node 203). However, in various embodiments, each of the second path 220 and the third path 225 may include a corresponding AC coupling capacitor, such as the AC coupling capacitor 222, particularly in distributed architectures.

As discussed above, because the DC coupled amplifier 230 is broad bandwidth amplifier, it provides the most significant portion of the total (extended) bandwidth, while the LNAs 240A, 240A and 240B, 250B incrementally increase the bandwidth of the DC coupled amplifier 230 at the high end frequencies by the amount of their narrow bandwidths, respectively. For example, the DC coupled amplifier 230 may provide 50 percent or more of the total bandwidth of the multi-path broadband amplifier 200. For instance, in the above example, the DC coupled amplifier 230 may provide a 50 GHz bandwidth from DC to about 50 GHz, the LNAs 240A and 250A may provide a 20 GHz bandwidth centered at about 60 GHz, and the LNAs 240B and 250B may provide a 20 GHz bandwidth centered at about 80 GHz. In this case the multi-path broadband amplifier 200 has a total bandwidth from DC to about 90 GHz, of which the DC coupled amplifier 230 provides about 55 percent of the total bandwidth.

Accordingly, characteristics of the multi-path broadband amplifier according to various embodiments may be adjusted by varying the number of (high frequency) paths connected in parallel with at least a portion of a first (low frequency) path, and/or by varying the number of LNAs connected in series within each of the high frequency paths. The greater the number of high frequency paths, the more the total bandwidth of the multi-path broadband amplifier is extended. Also, the greater the number of LNAs connected in series in each high frequency path, the higher the gain and delay of that high frequency path. In this manner, the multi-path broadband amplifier may be customized to provide unique benefits for any particular situation or to meet application specific design requirements of various implementations, as would be apparent to one skilled in the art.

Figure 3A:
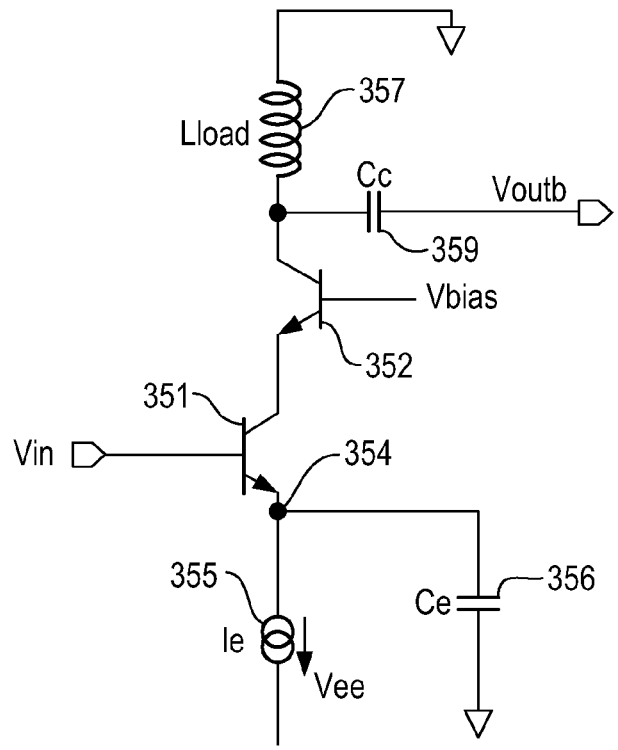
FIGS. 3A and 3B are simplified circuit diagrams illustrating a low noise amplifier and output stage of a multi-path broadband amplifier, according to representative embodiments.
Figure 3B:
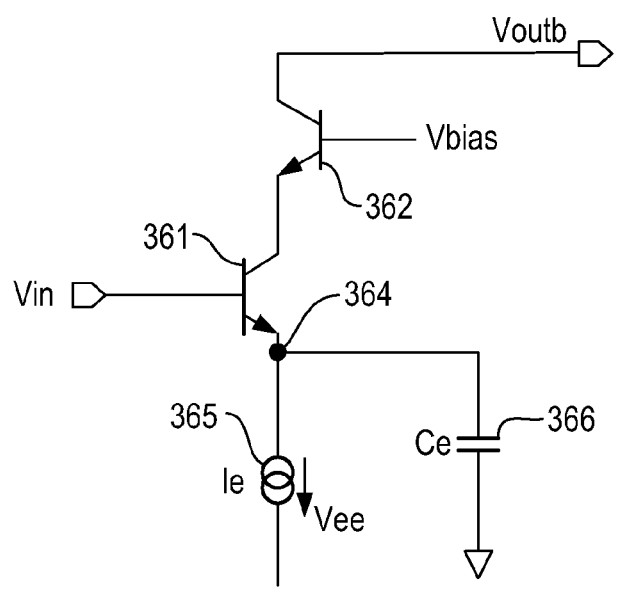

FIGS. 3A and 3B are simplified circuit diagrams illustrating an LNA and an LNA output stage of a multi-path broadband amplifier, according to representative embodiments.

Referring to FIG. 3A, representative LNA 350 includes cascoded first and second transistors 351 and 352. Each of the first and second transistors 351 and 352 may be a bi-polar junction transistor (BJT), for example, although other types of transistors, such as field-effect transistors (FETs), metal-oxide-semiconductor FETs (MOSFETs), and the like, may be incorporated without departing from the scope of the present teachings. The first transistor 351 includes a base corresponding to the input of the LNA 350 for receiving input voltage Vin, a collector, and an emitter connected to emitter node 354. The emitter node 354 is connected to current source 355 and is connected to ground via emitter capacitor 356. The second transistor 352 includes a base connected to a bias voltage Vbias, an emitter connected to the collector of the first transistor 351, and a collector connected to ground via load inductor 357. The bias voltage Vbias is a selected voltage that generally maintains the corresponding transistor (e.g., second transistor 352) in a safe and high performing operating range. Thus, each bias voltage Vbias associated with a transistor or circuit discussed herein is selected to optimize these factors, as would be apparent to one of ordinary skill in the art. The collector of the second transistor 352 is also connected to an output of the LNA 350 via coupling capacitor 359, providing output voltage Vout.

Referring to FIG. 3B, representative LNA output stage 360 includes cascoded first and second transistors 361 and 362. Each of the first and second transistors 361 and 362 may be a bi-polar junction transistor, for example, although other types of transistors, such as FETs, MOSFETs, and the like, may be incorporated without departing from the scope of the present teachings. The first transistor 361 includes a base corresponding to the input of the LNA output stage 360 for receiving input voltage Vin (e.g., corresponding to output voltage Vout of the LNA 350), a collector, and an emitter connected to emitter node 364. The emitter node 364 is connected to current source 365 (which may be the same as the current source 355) and is connected to ground via emitter capacitor 366. The second transistor 362 includes a base connected to bias voltage Vbias, an emitter connected to the collector of the first transistor 361, and a collector connected to an output of the LNA output stage 360, providing output voltage Vout. The output voltage Vout of the LNA output stage 360 may correspond to the output of the high frequency path to which the LNA 350 and the LNA output stage 360 belong.

As mentioned above, the LNA(s) (e.g., LNA 350) and the output stage (e.g., LNA output stage 360) may be combined in series (cascaded) to form one or more high frequency paths of a multi-path broadband amplifier, according to various embodiments. For example, FIGS. 4A and 4B are simplified circuit diagrams illustrating examples of multi-path broadband amplifiers, substantially corresponding to the block diagram shown in FIG. 1B, according to a representative embodiment.

Figure 4A:
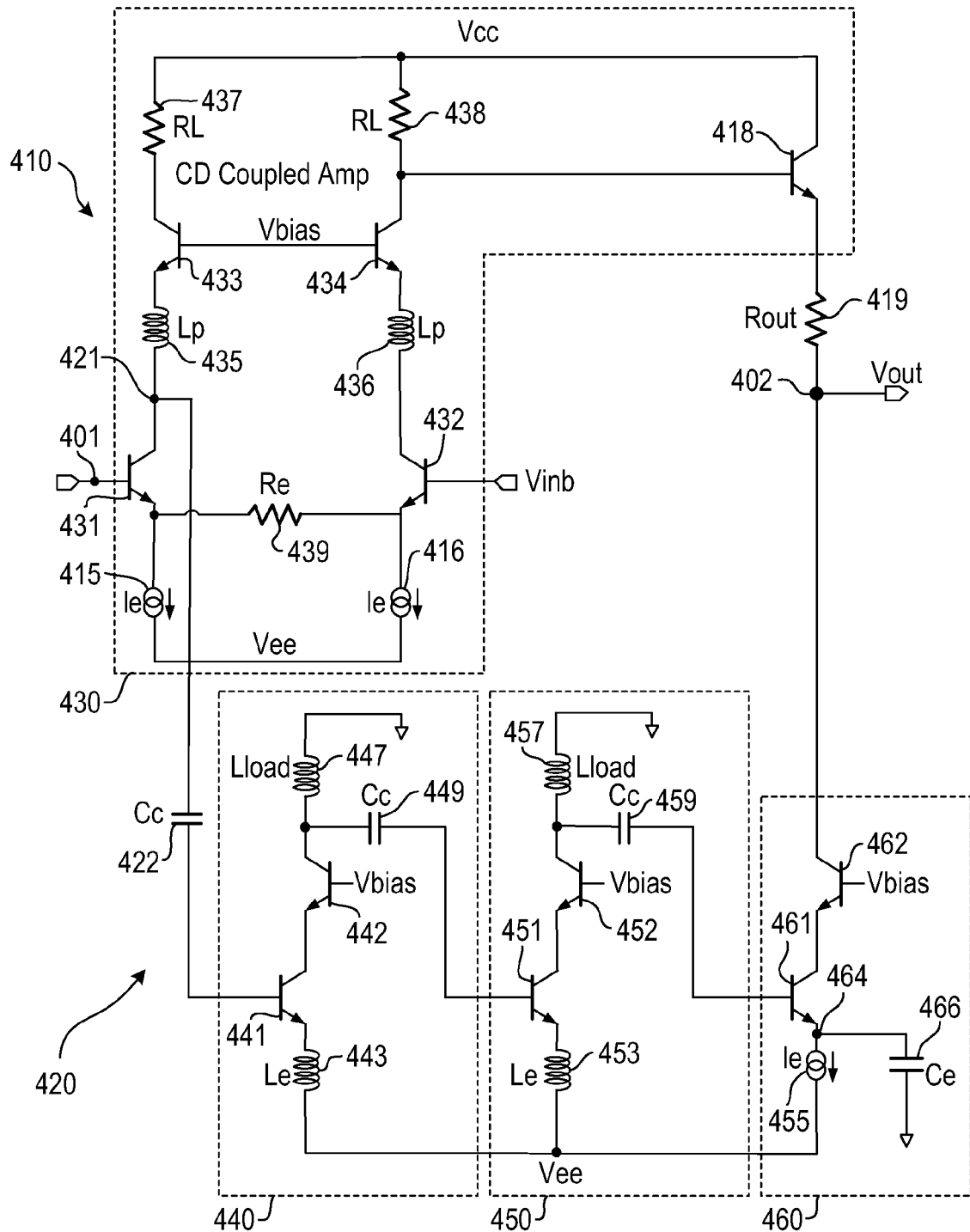
FIGS. 4A and 4B are simplified circuit diagrams illustrating multi-path broadband amplifiers, according to representative embodiments.
Figure 4B:
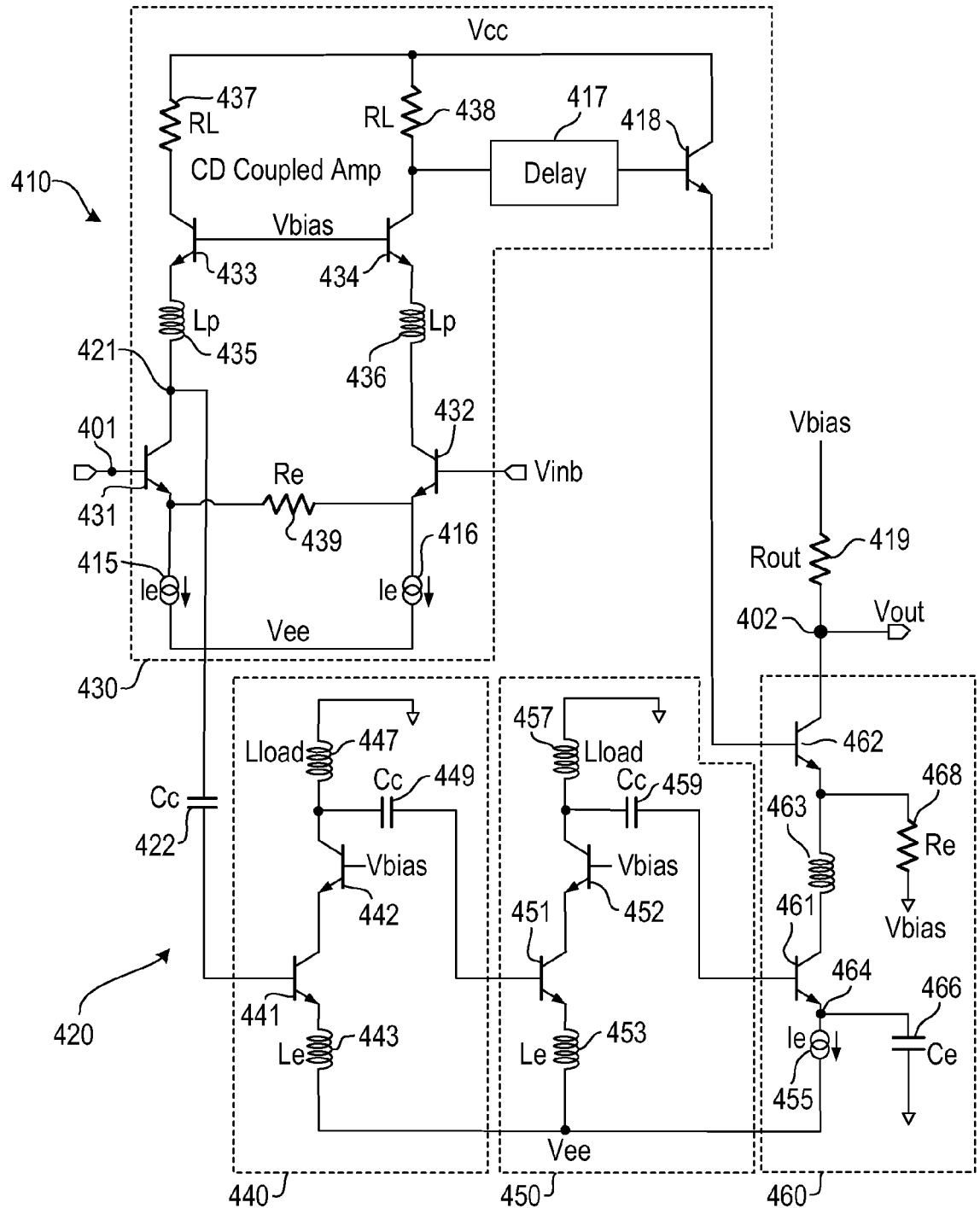

FIG. 4A depicts an illustrative configuration of multi-path broadband amplifier 400A, which is a dual path amplifier, and includes first path 410 and second path 420 connected in parallel with a portion of the first path 410. That is, the first path 410 originates at input node 401 and terminates at summing node 402, and the second path 420 originates at a high frequency pick-off node 421 of DC coupled amplifier 430 in the first path 410, as discussed below, and terminates at the summing node 402.

More particularly, the first path 410 includes the DC coupled amplifier 430 and the output resistor 419. The second path 420 includes AC coupling capacitor 422 and representative single-ended LNAs 440 and 450, connected in series. The second path 420 may further include an LNA output stage 460 connected in series to the LNA 450. As discussed above, although two representative LNAs are shown in FIG. 4A, for purposes of discussion, it is understood that the second path 420 may include one or more LNAs connected in series, without departing from the scope of the present teachings.

The DC coupled amplifier 430 is depicted as a differential amplifier, configured to receive input voltage Vin and inverted input voltage Vinb. In alternative embodiments, the DC coupled amplifier 430 may be a single ended amplifier, for example, without departing from the scope of the present teachings. The inputs of the DC coupled amplifier 430 correspond to first and second transistors 431 and 432. More particularly, the first transistor 431 includes a base corresponding to the input of the DC coupled amplifier 430 for receiving the input voltage Vin, a collector connected to high frequency pick-off node 421, and an emitter connected to current source 415. The second transistor 432 includes a base corresponding to the inverting input of the DC coupled amplifier 430 for receiving the inverted input voltage Vinb, a collector, and an emitter connected to the current source 416, which may have the same value as the current source 415. In addition, the emitters of the first and second transistors 431 and 432 are connected to one another via resistor 439.

The DC coupled amplifier 430 further includes third and fourth transistors 433 and 434 respectively connected to the collectors of the first and second transistors 431 and 432. More particularly, the third transistor 433 includes a base connected to a bias voltage Vbias, an emitter connected to the collector of the first transistor 431 via inductor 435, and a collector connected to an output stage of the DC coupled amplifier 430, discussed below, via resistor 437. The fourth transistor 434 includes a base connected to the bias voltage Vbias, an emitter connected to the collector of the second transistor 432 via inductor 436, and a collector connected to the output stage, directly and via resistor 438.

The output stage of the DC coupled amplifier 430 includes fifth transistor 418. The fifth transistor 418 includes a base connected to the collector of the fourth transistor 434, a collector connected to the collectors of the third and fourth transistors 433 and 434 via the resistors 437 and 438, respectively, and an emitter corresponding to the output of the fifth transistor 418. The output of the fifth transistor 418 is connected to the summing node 402 of the multi-path broadband amplifier 400A via output resistor 419. Each of the first through fourth transistors 331 to 334 may be a BJT, for example, although other types of transistors, such as FETs, MOSFETs, and the like, may be incorporated without departing from the scope of the present teachings.

The second path 420 includes the AC coupling capacitor 422, the LNA 440, the LNA 450 and the LNA output stage 460 connected in series between the high frequency pick-off node 421 and the summing node 402. The LNAs 440 and 450 may be substantially the same as the LNA 350 discussed above with reference to FIG. 3A, and the LNA output stage may be substantially the same as the LNA output stage 360 discussed above with reference to FIG. 3B.

More particularly, LNA 440 includes first and second transistors 441 and 442. The first transistor 441 includes a base corresponding to the input of the LNA 440 for receiving input voltage Vin from the high frequency pick-off node 421 via the AC coupling capacitor 422. The high frequency pick-off node 421 is only one transistor (e.g., the first transistor 431) into the DC coupled amplifier 430, and therefore the input voltage Vin at the high frequency pick-off node 421 has substantially the same bandwidth as the input voltage Vin at the input node 401. The first transistor 441 further includes a collector, and an emitter connected to current source 455 via emitter inductor 443. The second transistor 442 includes a base connected to a bias voltage Vbias, an emitter connected to the collector of the first transistor 441, and a collector connected to ground via load inductor 447. The collector of the second transistor 442 is also connected to an output of the LNA 440 via coupling capacitor 449.

As discussed above, the LNA 450 is connected in series (cascaded) with the LNA 440, and includes first and second transistors 451 and 452. The first transistor 451 includes a base corresponding to the input of the LNA 450 for receiving the output of the LNA 440 via the coupling capacitor 449. The first transistor 451 further includes a collector, and an emitter connected to the current source 455 via emitter inductor 453. The second transistor 452 includes a base connected to a bias voltage Vbias, an emitter connected to the collector of the first transistor 451, and a collector connected to ground via load inductor 457. The collector of the second transistor 452 is also connected to an output of the LNA 450 via coupling capacitor 459. The bias voltage Vbias may be the same as or different from the bias voltage Vbias of the LNA 440, depending on the desired characteristics.

Also as discussed above, the LNA output stage 460 is connected in series (cascaded) with the LNA 450, and includes first and second transistors 461 and 462. The first transistor 461 includes a base corresponding to the input of the LNA output stage 460 for receiving the output of the LNA 450 via the coupling capacitor 459. The first transistor 461 further includes a collector, and an emitter connected to emitter node 464. The emitter node 464 is connected to the current source 455 and is connected to ground via emitter capacitor 466. The second transistor 462 includes a base connected to a bias voltage Vbias, an emitter connected to the collector of the first transistor 461, and a collector connected to an output of the LNA output stage 460, which corresponds to the summing node 402. The bias voltage Vbias may be the same as or different from the bias voltage(s) Vbias of the LNAs 440 and 450, depending on the desired characteristics. In the depicted configuration, the frequency band of operation is primarily set by the load inductor 457 and the coupling capacitor 459 on the collector of the second transistor 452 of the cascaded LNA 450. In addition, the gain of the second path 420 may be controlled, at least in part, by the current source 455. The second transistor 452 may be detuned using a collector and/or emitter resistor (not shown) to achieve lower gain and broader bandwidths to build the desired high frequency profile, for example.

FIG. 4B depicts another illustrative configuration of a multi-path broadband amplifier 400B. The multi-path broadband amplifier 400B is a dual path amplifier, and includes first path 410 and second path 420 connected substantially in parallel with a portion of the first path 410. That is, the first path 410 originates at input node 401 and terminates at summing node 402, and the second path 420 originates at a high frequency pick-off node 421 of DC coupled amplifier 430 in the first path 410, as discussed above, and terminates at the summing node 402. The multi-path broadband amplifier 400B is substantially the same as the multi-path broadband amplifier 400A shown in FIG. 4A, except that it includes delay means (delay element 417) in the first path 410 and a different configuration of the LNA output stage (LNA output stage 460) in second path 420. Therefore, description of the like elements will not be repeated.

The delay element 417 is connected between the collector of the fourth transistor 434 and the base of the fifth transistor 418. The delay element 417 may be a transmission line, for example, the length of which determines, in part, the delay introduced by the DC coupled amplifier 430. The delay element 417 may therefore be adjusted to help match the delays of the first path 410 and the second path 420, in order to provide in-phase signals at the summing node 402, respectively.

The LNA output stage 460 is connected in series (cascaded) with the LNA 450, and includes first and second transistors 461 and 462. The first transistor 461 includes a base corresponding to the input of the LNA output stage 460 for receiving the output of the LNA 450 via the coupling capacitor 459. The first transistor 461 further includes a collector, and an emitter connected to emitter node 464. The emitter node 464 is connected to the current source 455 and is connected to ground via emitter capacitor 466. The second transistor 462 includes a base connected to the emitter of the fifth transistor 418, which corresponds to the output of the DC coupled amplifier 430. The second transistor 462 further includes an emitter connected to the collector of the first transistor 461 via inductor 463, and a collector connected to an output of the LNA output stage 460, which corresponds to the summing node 402.

A bias voltage Vbias is applied to the emitter of the second transistor 462 via resistor 468. Another bias voltage Vbias is applied to the summing node 402 via output resistor 419. The bias voltage Vbias applied to the emitter of the second transistor 462 and the bias voltage Vbias applied to the summing node 402 may be the same as or different from one another and/or the bias voltage(s) Vbias of the LNAs 440 and 450, depending on the desired characteristics. The configuration of the LNA output stage 460 shown in FIG. 4B requires less voltage gain in the first path 410 than the LNA output stage 460 in FIG. 4A. In FIG. 4A, up to half of signal amplitude may be lost in the output stage across the output resistor 419. Also, the multi-path broadband amplifier 400B reuses the current of the LNA output stage 460, which saves power.

The values of the components of various embodiments may vary to provide unique benefits for any particular situation or to meet application specific design requirements of various implementations, as would be apparent to one skilled in the art. For example, each of the inductors 435, 436, 443, 447, 453 and 457 may have a value of about 50 pico-henries (ph), each of the capacitors 449, 459 and 466 may have a value of about 250 femto-farads (ff), each of the resistors 437, 438 and 439 may have a value of about 100 ohms and the output resistor 419 may have a value of about 50 ohms.

Figure 5:
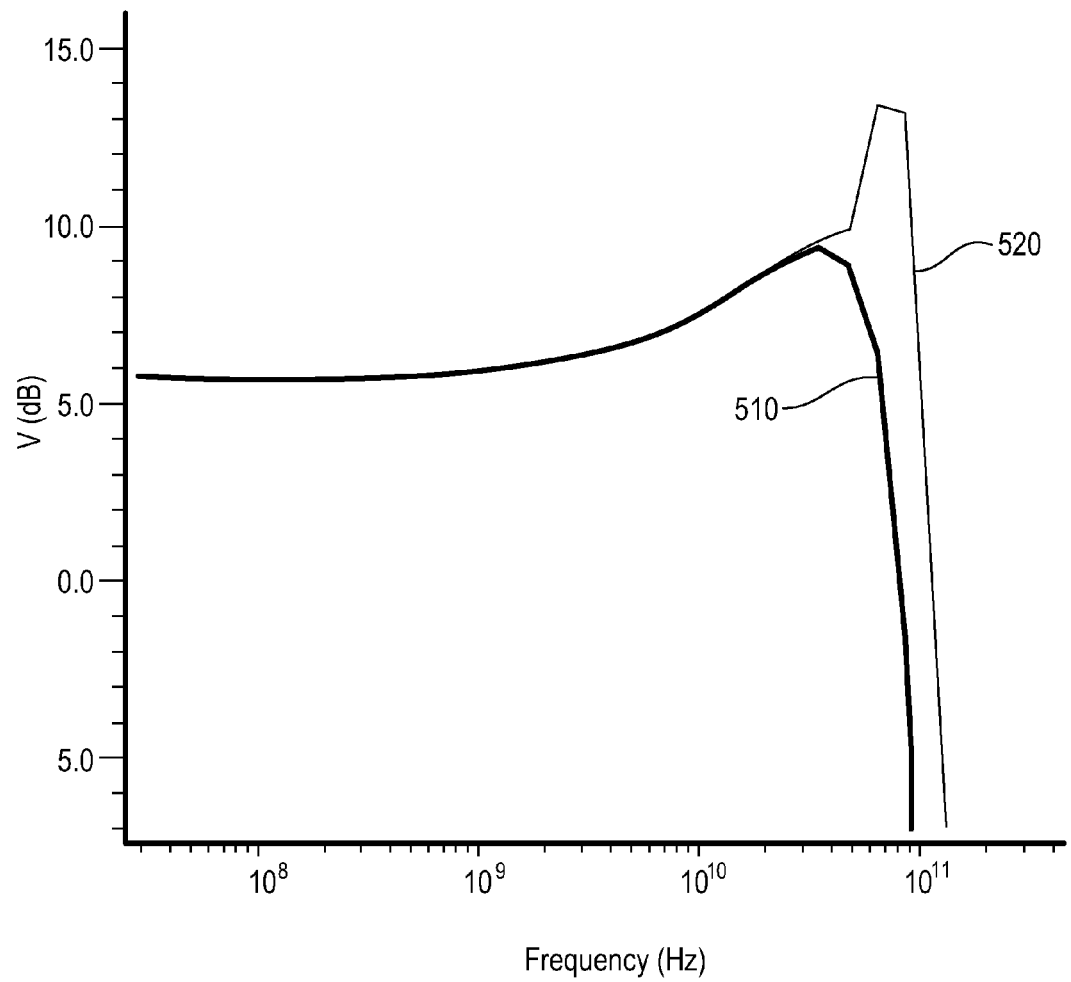
FIG. 5 is a graph illustrating frequency responses of a conventional broadband amplifier and the multi-path broadband amplifier, according to a representative embodiment.

FIG. 5 is a graph illustrating frequency responses of a DC coupled broadband amplifier and a multi-path broadband amplifier, e.g., as shown in the circuit diagram of FIG. 4A, according to a representative embodiment.

More particularly, referring to FIG. 5, trace 510 indicates single-ended frequency response of a DC coupled broadband amplifier, such as DC coupled amplifier 430 in the first path 410 of FIG. 4A. Trace 520 indicates single-ended frequency response of the multi-path broadband amplifier 400A depicted in FIG. 4A. Notably, the frequency response is substantially the same for both traces 510 and 520 until reaching the high end frequency of the DC coupled amplifier 430. At this point, the LNAs 440 and 450 in the second path 420 effectively extend the total bandwidth about another 10 GHz. The magnitude and the delay of the second path 420 are adjusted, e.g., by the number of LNAs included in the second path 420, to substantially match the magnitude and the delay of the first path 410, accounting for the smooth transition to the frequency response in the high frequency range by the LNAs 440 and 450.

Multi-path broadband amplifiers according to various embodiments exhibit favorable characteristics of two types of amplifiers, and are generally able to achieve higher bandwidths than conventional single and multi-path amplifiers. For example, the multi-path broadband amplifiers according to various embodiments are able to retain frequency flatness down to DC like traditional DC coupled amplifiers, while adding low noise, high gain, high frequency characteristics of LNAs. The bandwidth of the DC coupled amplifier should be kept as high as possible (e.g., as a percentage of the total bandwidth), so that the LNAs only carry the bandwidth in the upper one half to one tenth of the frequency range, for example.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. An amplifier device having an extended total bandwidth, the amplifier device comprising:
    a DC coupled amplifier having a broad bandwidth; and
    a plurality of first low noise amplifiers connected in series with one another and connected in parallel with at least a portion of the DC coupled amplifier, the plurality of first low noise amplifiers having a first narrow bandwidth and a center frequency higher than a high end frequency of the broad bandwidth,
    wherein the extended total bandwidth of the amplifier device comprises a combination of the broad bandwidth and the first narrow bandwidth, and
    wherein the broad bandwidth of the DC coupled amplifier provides at least 50 percent of the extended total bandwidth.

2. The amplifier device of claim 1, wherein the DC coupled amplifier comprises a high frequency pick-off node, and an input of one of the plurality of first low noise amplifiers is connected to the high frequency pick-off node of the DC coupled amplifier.

3. The amplifier device of claim 1, further comprising:
    an input node configured to receive an input voltage signal, wherein an input of the DC coupled amplifier and an input of one of the plurality of first low noise amplifiers is connected to the input node.

4. The amplifier device of claim 1, wherein the number of first low noise amplifiers is determined such that amplitude and phase of a narrow bandwidth signal output by the plurality of first low noise amplifiers matches amplitude and phase of a broadband signal output by the DC coupled amplifier.

5. The amplifier device of claim 4, wherein an overall magnitude response of an output signal of the amplifier device is substantially flat, and an overall phase response of the output signal of the amplifier device is linear or transitions smoothly.

6. The amplifier device of claim 4, wherein the DC coupled amplifier comprises a delay element configured to adjust the phase of the broadband signal output by the DC coupled amplifier.

7. The amplifier device of claim 1, further comprising:
a plurality of second low noise amplifiers connected in series with one another and connected in parallel with the plurality of first low noise amplifiers, the plurality of second low noise amplifiers having a second narrow bandwidth,
wherein the extended bandwidth of the amplifier device comprises a combination of the broad bandwidth and the first and second narrow bandwidths.

8. The amplifier device of claim 1, wherein a gain of the plurality of first low noise amplifiers is based, in part, on the number of first low noise amplifiers connected in series.

9. The amplifier device of claim 1, wherein the DC coupled amplifier is one of a single-ended amplifier and a differential amplifier.

10. The amplifier device of claim 9, wherein each of the first low noise amplifiers is one of a single-ended amplifier and a differential amplifier.

11. The amplifier device of claim 1, wherein the broad bandwidth of the DC coupled amplifier is in a range of about 30 GHz to about 50 GHz, and the narrow bandwidth of the plurality of low noise amplifiers is in a range of about 4 GHz to about 40 GHz.

12. The amplifier device of claim 1, wherein each of the plurality of first low noise amplifiers comprises:
a first transistor having a base corresponding to an input of the first low noise amplifier; and
a second transistor having a base connected to a bias voltage, an emitter connected to a collector of the first transistor, and a collector connected to ground via a load inductor and connected to an output of the first low noise amplifier via a coupling capacitor.

13. The amplifier device of claim 10, further comprising:
an output stage connected in series with the plurality of first low noise amplifiers, the output stage comprising:
a third transistor having a base connected to the output of a first low noise amplifier; and
a fourth transistor having a base connected to a bias voltage, an emitter connected to a collector of the third transistor, and a collector comprising an output to be combined with an output of the DC coupled amplifier.

14. An amplifier device, comprising:
a first path including a DC coupled amplifier, the first path having a first path delay;
a second path connected in parallel with the first path and including an AC coupling capacitor connected in series with at least one high frequency amplifier, the second path having a second delay that is substantially the same as the first delay;
a third path including at least one high frequency amplifiers connected in parallel with the at least one high frequency amplifier of the second path, the third path having a third delay that is substantially the same as the first and second delays; and
a summing node configured to combine a first signal output by the first path and a second signal output by the second path to provide an output signal of the amplifier device,
wherein a total bandwidth of the amplifier device comprises a combination of a broad bandwidth of the DC coupled amplifier and a narrow bandwidth of the at least one high frequency amplifier, and
wherein the at least one high frequency amplifier has a center frequency higher than a high end frequency of the broad bandwidth of the DC coupled amplifier.

15. The amplifier device of claim 14, wherein the broad bandwidth of the DC coupled amplifier provides at least 50 percent of the total bandwidth of the amplifier device.

16. An amplifier having an extended bandwidth, the amplifier device comprising:
a first path comprising a DC coupled amplifier having a broad bandwidth; and
a second path comprising an AC coupling capacitor, connected to a high frequency pick-off node of the DC coupled amplifier, and at least one first low noise amplifier and an output stage connected between the coupling capacitor and a summing node, the at least one first low noise amplifier having a first narrow bandwidth and a center frequency higher than a high end frequency of the broad bandwidth of the DC coupled amplifier,
wherein an output of the DC coupled amplifier is connected to one of the output stage and the summing node,
wherein the extended bandwidth of the amplifier device at the summing node comprises a combination of the broad bandwidth and the first narrow bandwidth, and
wherein the number of first low noise amplifiers is determined such that amplitude and phase of a signal output by the second path matches amplitude and phase of a signal output by the first path at the summing node.

17. The amplifier device of claim 16, further comprising:
a third path comprising at least one second low noise amplifier connected between the coupling capacitor and the summing node in parallel with the at least one first low noise amplifier, the at least one second low noise amplifier having a second narrow bandwidth substantially the same as the first narrow bandwidth,
wherein the extended bandwidth of the amplifier device comprises a combination of the broad bandwidth and the first and second narrow bandwidths.

* * * * *